United States Patent [19]

Denison et al.

[11] Patent Number: 4,881,033

[45] Date of Patent: Nov. 14, 1989

[54] NOISE-REDUCED SYNTHETIC T2 WEIGHTED IMAGES

[75] Inventors: Kenneth S. Denison, Shaker Hts.; G. Neil Holland, Chagrin Falls; Gordon D. DeMeester, Wickliffe, all of Ohio

[73] Assignee: Picker International, Inc., Highland Hts., Ohio

[21] Appl. No.: 331,750

[22] Filed: Apr. 3, 1989

Related U.S. Application Data

[63] Continuation of Ser. No. 66,039, Jun. 24, 1987, abandoned.

[51] Int. Cl.$^4$ ............................................. G01R 33/20
[52] U.S. Cl. .................................................... 324/309
[58] Field of Search ......................................... 324/309

[56] References Cited

U.S. PATENT DOCUMENTS

| 4,611,172 | 9/1986 | Takase | 324/314 |
| 4,684,891 | 8/1987 | Feinberg | 324/309 |
| 4,701,706 | 10/1987 | Haacke | 324/309 |

OTHER PUBLICATIONS

"Measurement-Dependent Filtering: A Novel Approach to Improved SNT" by Macovski et al., IEEE, vol. M1-2, No. 3, 9/83, pp. 122-127.
"Noise Reduction in Selective Magnetic Resonance Imaging" by Brosnan et al., Society for MRI, 5th Annual Meeting, Feb./Mar. 1987.
"Automatic Correction of Nuclear Magnetic Resonance Zeugmatographic Projections" by Lai et al., Phsy. E. Scie. Inst., vol. 14, 1981, pp. 874-879.

*Primary Examiner*—Stewart J. Levy
*Assistant Examiner*—Lawrence G. Fess
*Attorney, Agent, or Firm*—Fay, Sharpe, Beall, Fagan, Minnich & McKee

[57] ABSTRACT

A multi-echo magnetic resonance imaging sequence is implemented such that a radio frequency receiver (34) receives magnetic resonance signals during each of a plurality of magnetic resonance echoes. The resonance data received during each echo are digitized and the resultant echo data are stored in a corresponding echo memory (40, 42). The locations of the data within the memories are brought into registration (52) such that corresponding data in each memory is disposed at the same memory address. Because data from later echoes tends to be weaker or at a lower magnitude, the magnitude of the data stored in each memory is normalized (60). The phase of the data in each memory is brought into coordination by a zero order phase correction (70). A high pass filter (84) and a complementary low pass filter (86) separate complementary portions of the data from the memories. The separated portions are combined into a single synthesizied data set for storage in memory (82). The syntheized data are Fourier transformed (100) to produce a synthetic image which has selected characteristics of an early echo image, e.g. high resolution, and selected characteristics of a late echo image, e.g. good T2 contrast. In this manner, the synthetic image has properties or characteristics which render it more diagnostically valuable than either an early or late echo image.

22 Claims, 9 Drawing Sheets

NOISE-REDUCED SYNTHETIC T2 WEIGHTED IMAGES

This application is a continuation of U.S. application Ser. No. 066,039, filing data 6/24/87, now abandoned.

Background of the Invention

The present invention relates to the art of diagnostic imaging. It finds particular application in conjunction with T2 weighted magnetic resonance imaging and will be described with particular reference thereto. It is to be appreciated, however, that the present invention may also be applicable to other image, enhancement, modification, and improvement techniques.

Heretofore, medical diagnostic magnetic resonance imaging has included the sequential pulsing of radio frequency signals and magnetic field gradients across a region to be imaged. In two dimensional imaging, a patient is disposed within a region of interest in a substantially uniform main magnetic field. A slice select gradient is applied across the field to select a slice or other region of the patient to be imaged. A phase encode gradient is applied along one of the axes of the selected slice to encode the material with a selected phase angle along the phase encode axis. In each repetition of the pulse sequence, the phase encode gradient is stepped in regular increments between plus and minus Gmax, the maximum phase encode gradient.

A magnetic resonance inversion and/or other manipulation pulse is applied to cause a magnetic resonance echo. Additional inversion and/or other magnetization manipulating pulses are applied to create additional echoes following the same resonance excitation. Each repetition of the pulse sequence produces one set of sampled data points, generally termed a view or step, for each monitored echo. The set of views corresponding to each echo is separately Fourier transformed into an image representation. Alternately, image noise can be reduced and improved by time sampling and summing data or image echoes in each sequence.

Each view is phase encoded with a corresponding one of the phase encode gradient increments along one axis and frequency encoded along another. The central or zero phase encoded views and the low frequency components within each view contribute primarily to the contrast of the resultant multiple view image. The views phase encoded near the plus and minus Gmax and the high frequency components of each view contribute primarily to the fine detail or resolution.

The image from the first or earliest echo has the best fine detail and spatial resolution. The later echo images become noisier and the resolution degrades. However, the later images have other properties, such as a better resolved T2 contrast, which make them diagnostically more advantageous than the early images. Thus, for good detailed resolution, an early echo image is selected; whereas, for good T2 contrast a late echo image is selected.

The reduced signal-to-noise and anatomical detail of the late echo or long TE images compromise their diagnostic value. To improve the late echo diagnostic value, it has been proposed that a complete early echo image and a complete late echo image be combined and further processed to produce one synthetic image with selected characteristics of each. More, specifically, measurement dependent filtering is utilized to remove the low spatial frequency contribution from the complete late echo image and the high spatial frequency contribution from the complete early echo image. A spatially-variant control function determines the relative amounts of high and low frequency information that are combined into the single synthetic image. However, manipulating and combining the complete transformed image data is computationally intensive and required significant computer time.

The present invention provides a new and improved synthetic imaging technique.

SUMMARY OF THE INVENTION

In accordance with one aspect of the present invention, a synthetic imaging method is provided. Two sets of data representing at least partially differing properties of a subject in an image region are collected substantially concurrently. A fraction of one data set is combined with a complementary fraction of the other data set to produce a synthesized data set. A synthetic image representation is reconstructed from the synthetic data set.

In accordance with a more limited aspect of the present invention, a method of multiple echo magnetic resonance imaging is provided. Portions of the data collected during each of at least two echoes are combined. The combined echo data is transformed into a synthesized image representation.

In accordance with a yet more limited aspect of the present invention, high frequency components are separated from early echo data and low frequency components are separated from late echo data. The separated high and low frequency components are combined and transformed into the synthetic image. Preferably, the high and low frequency components are separated using complementary high and low pass filters.

In accordance with another aspect of the present invention, an imaging apparatus is provided for producing a synthetic image representation. Means are provided for exciting resonance, causing echoes, and phase encoding the resonance. A collecting means receives resonance signals generated during first and second echoes. A first and second echo memory means stores the echo data corresponding to the first and second echoes, respectively. A filter means separate complementary portions of the data from the first and second echo data memory means, respectively. A transforming means transforms the separated, complementary echo data portions into the synthetic image representation.

In accordance with a more limited aspect of the present invention, one of the data sets represents early echo data and the other represents late echo data.

In accordance with a yet more limited aspect of the present invention, the filter means separates low frequency components from the late echo data and complementary high frequency components from the early echo data.

One advantage of the present invention is that low noise, high contrast, high anatomical detail synthetic images are produced. The best features of short and long echo time images are achieved in a single image.

Another advantage of the present invention is that the computational load is reduced.

Another advantage of the present invention resides in the elimination of image phase errors.

Yet another advantage of the present invention resides in the elimination of misalignment between short and long echo time images.

Still further advantages of the present invention will become apparent to those of ordinary skill in the art upon reading and understanding the followed detailed description of the preferred embodiment.

BRIEF DESCRIPTION OF THE DRAWINGS

The invention may take form in various steps and arrangements of steps and in various components and arrangements of components. The drawings are only for purposes illustrating a preferred embodiment and are not to be construed as limiting the invention.

DETAILED DESCRIPTION OF THE PREFERRED EMBODIMENT

Figure 1:
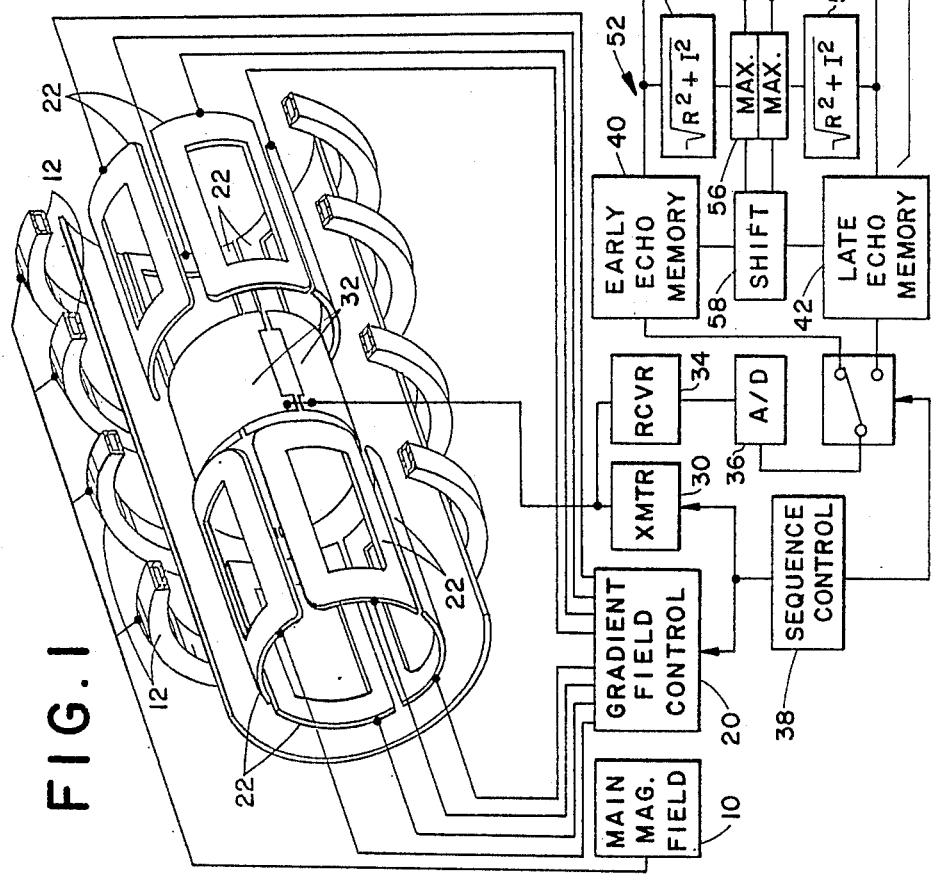
FIG. 1 is a diagrammatic illustration of a magnetic resonance imaging apparatus in accordance with the present invention; and, FIG. 2 is a graphic representation to assist in conceptualizing a synthetic array of views or set of data for transformation into an image representation.

With reference to FIG. 1, magnetic resonance is excited in an image region of a magnetic resonance imaging apparatus. A main magnetic field means, including a main magnetic field controller 10 and a plurality of electromagnets 12, generate a substantially uniform, main magnetic field through the image region. A gradient field control means 20 selectively controls the application of gradient fields across the main magnetic field by gradient field coils 22. By selectively applying current pulses to appropriate ones of the gradient field coils, slice select, phase encode, and read gradients are selectively applied along mutually orthogonal axes to define an image slice or region. A transmitter 30 selectively supplies radio frequency pulses to RF coils 32 to excite dipoles in the image region to magnetic resonance and to manipulate or orient the magnetization of the resonating dipoles. Magnetic resonance signals generated by the resonating dipoles are received by the RF coils 32. A radio frequency receiver 34 demodulates the received radio frequency signals to a band width of $f_o \pm \Delta f$, where $f_o$ is preferably zero. The signals are digitized by an analog-to-digital converter 36. A timing and control means 38 controls the timing and application of the gradient and radio frequency pulses to perform imaging sequences as are well known in the art.

Each imaging sequence commonly includes causing the gradient field control means 20 to apply a slice select gradient along the main magnetic field. The transmitter 30 generates an RF magnetic resonance excitation pulse and the gradient field control causes slice select and phase encode gradient pulses. A magnetic resonance inversion pulse from transmitter 30 causes a first or early echo concurrently with application of one or more read gradient pulses by the gradient control means. During the first echo, a magnetic resonance signal is received by the receiver 34 and digitized by the analog-to-digital converter 36 to form a first view or line of digital data corresponding to the first echo. Another magnetic resonance inversion pulse along with at least one additional read gradient pulse is applied to cause a second echo. The magnetic resonance signal during the second echo is received by the receiver 34 and digitized by the analog-to-digital converter 36 to form one view or a line of second echo digital data. The application of inversion and read gradient pulses is repeated to form third, fourth, and subsequent later echoes each of which is received and digitized. The views corresponding to each echo are stored in corresponding view memories, such as a first or early echo view memory 40 and a late echo view memory 42.

Each view is commonly identified by the value of the phase encoding gradient with which the resonance data was encoded. Commonly, a preselected number of views, e.g. 256 views, corresponding to phase encode gradients that vary in like step from $-G_{max}$ to $+G_{max}$, are collected separately for each echo. Each view or data line is frequency encoded by the read gradient pulse and includes a plurality of frequency components. The low frequency components of each view, i.e. the data near the zero frequency center of the line or view, contributes to contrast of the final image. The high frequency components near the ends of each line or view contribute to the detail or resolution. Analogously, the views which are phase encoded with a phase encoding gradient close to zero contribute low frequency components to the resultant image, hence, more contrast and less detail or resolution. The larger phase encoded views, i.e. those towards plus or minus $G_{max}$, contribute the highest frequency components to the resultant image, hence, contribute more to the resolution and less to the contrast.

The data in each echo memory may be conceptualized as a rectangular array or matrix of data points each having a real and an imaginary part. The matrix has a frequency axis which may be conceptualized as the horizontal axis and a phase encode axis conceptualized as vertical. The data points along a horizontal row of memory elements would be the digitized resonance data of a single view. The data points along a vertical column would be the corresponding frequency data points taken with each of the different phase encode gradient steps or values.

Commonly, the data in the two echo data memories will not be in exact correspondence. Rather, the central frequency may be shifted or off center in one of the matrices, the phase angle may have an offset or different offsets, and the magnitude of the late echo data is conventionally lower than the magnitude of the early echo data. Early and late echo correlation means 50 are provided to correlate the data in the early and late echo data memory means.

A centering means 52 centers the data in each of the echo memories. Preferably, the centering means centers each ray of views along both axes. That is, the centering means searches for the data value corresponding to the center or minimum frequency of the view with the zero or minimum phase encoding. This central frequency and phase data value corresponds to the strongest resonance signal, hence can be identified by its maximum amplitude. The data in each memory is shifted to move the central data value to a preselected address, preferably the center. Any empty data points at the edges may be filled with a zero and any extra data points at the other edges may be discarded.

More specifically, a magnitude means 54 measures the magnitude of the complex data values stored at each data point of the first and second echo data memory means. Preferably, the magnitude is measured by taking the square root of the sum of the square of the real part and the square of the imaginary part. A maximum searching means 56 locates the maximum magnitude data value stored in each memory means. A data shifting means 58 shifts the data in each memory means such that the maximum magnitude data value is in the center of the matrix and fills any empty data points with data values of zero.

Normally, the later echoes are weaker than the earlier echoes which causes a correspondingly lower magnitude in the later echo data points. A normalizing means 60 normalizes the early and late echo data. In the preferred embodiment, the normalizing means includes a ratio means 62 for determining the ratio of maximum early echo magnitude to the maximum late echo magnitude. A multiplier 64 multiplies the smaller, late echo data values by the ratio. This enlarges the late echo data to correspond to the early echo data.

After the data is normalized, a zero order phase correction means 70 rotates the data values of each matrix such that the data value at the center data point have the same vector angle, preferably by zeroing the imaginary part of both. A complex conjugate means 72 determines the complex conjugate of the maximum magnitude data value that was shifted to the center data point. A first multiplying means 74 multiplies each data value of the early echo memory means 40 by the complex conjugate of the largest magnitude data value from the central early echo data point. Analogously, a second multiplying means 76 multiplies each data value of the late echo memory 42 by the complex conjugate of maximum magnitude data value from the late echo memory central data point. This rotates the phase of each data value in each of the early and late echo matrices by consistent amounts which bring the phase of the central data point of both memory means into correspondence.

Optionally, other data corrections or adjustments may be made to the data. For example, redundant views may be collected and averaged, each view may be adjusted, aligned, or correlated with the other views in the same echo data memory means, or the like.

A combining means 80 combines a portion of the early echo data with a complementary portion of the late echo data to produce a synthesized data set which is stored in a synthetic data memory 82. Preferably, the combining means includes a digital high pass filter 84 for separating the high frequency components of the early echo data and a digital low pass filter 86 for separating the complementary low frequency data of the late echo data set. Preferably, the filters are roll-off filters such that when combined the data adjacent the high/low frequency interface is averaged or smoothed.

Figure 2:
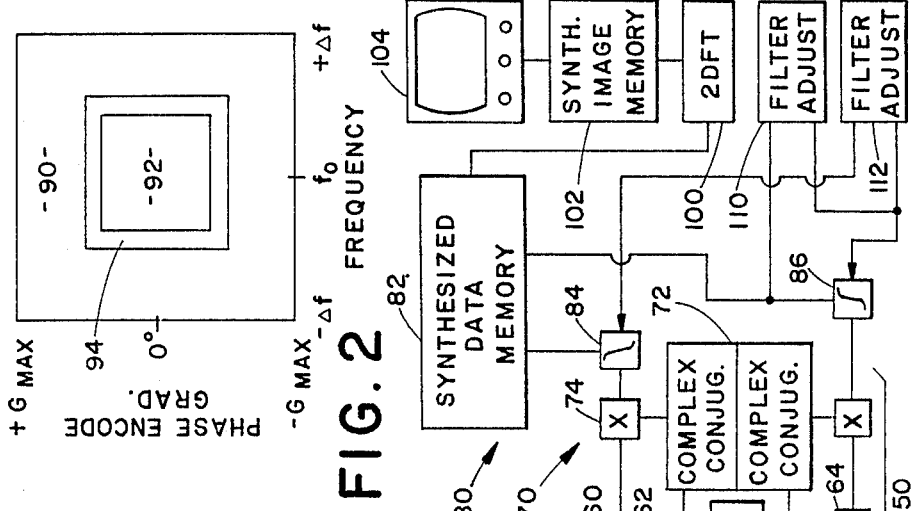

As illustrated in FIG. 2, the high pass filter 84 passes the high frequency data values from the data points in a peripheral region 90 of the early echo memory means 40. That is, it passes the data attributable to the large or higher phase encode values and the high frequency portions of the data attributable to the low phase encoded data. The low pass filter 86 passes the low frequency data values which are found in a central region of the more centrally or lower phase encoded data lines. The use of roll-off filters creates a region 94 in which the high frequency data of the early echo and the low frequency data of the late echo are averaged. By selecting complementary filters, the synthesized data set includes a single, complex data value for each data point. No data points are skipped and none are provided with two data values. The data points in the peripheral region 90 come from the corresponding data points in the early echo memory means. The data points in the central region 92 come from the corresponding data points of the late echo memory means. The data points in the interface region are the sum of complementary fractional portions of the corresponding data points of the early and late echo memory means. For example, the complementary fractional portions may be one quarter of one and three quarters of the other or one half of each, or one eighth and seven eighths, etc.

A two dimensional Fourier transform means 100 transforms the synthesized data in the synthetic data memory 82 into a image representation for storage in a synthetic image memory 102. A man readable display means 104 may be provided for displaying from the synthetic image memory.

For greater versatility, the interface between the high and low frequency regions is adjustable. A filter adjusting means 110 adjusts the complementary slope of filters 84, 86. At one extreme the complementary filters may be opposite step functions such that region 94 is eliminated and each data point of the synthesized data matrix is attributed solely to one of the early and late echo data sets. The filter adjusting means may increase the amount of roll-off which increases the width of the averaged region 84.

A second adjusting means 112 adjusts the relative contribution of the early and late echo data. Conceptually, this may be visualized as adjusting the relative sizes of regions 90 and 92. When the late echo is relatively noise-free, the size of region 92 may be increased relative to the size of region 90. This increases the contribution from the late echo data and emphasizes the improved contrast aspect of the invention. When the late echo is relatively noisy, it may be advantageous to reduce its contribution by reducing the size of region 92 and increasing the size of region 90. This improves the resolution of the resultant image.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims and the equivalents thereof.

Having thus described the preferred embodiment, the invention is now claimed to be:

1. A method of magnetic resonance imaging comprising:
    after each excitation of magnetic resonance, causing a plurality of magnetic resonance echoes, early echoes close in time to the excitation having better resolution of details of structure in the image region and poorer T2 contrast and late echoes further in time from the excitation having poorer structural detail resolution and better T2 contrast;
    collecting magnetic resonance signals during the early and late echoes to collect early echo data and late echo data;
    combining a fractional portion of the early echo data with a fractional portion of the late echo data which is complementary to the early echo data portion to produce a synthesized data set; and,
    Fourier transforming the synthesized data set to produce a synthetic image which has characteristics of an early echo image and characteristics of a late echo image.

2. The method as set forth in claim 1 wherein the combining step includes separating high frequency components from the early echo data and low frequency components from the late echo data and combining the separated high and low frequency components, whereby the synthetic image has detail resolution and T2 contrast.

3. The method as set forth in claim 2 further including:
before the combining step, storing the collected magnetic resonance signals collected during an early echo and storing the late echo data collected during the late echo; and
wherein the combining step includes combining the fractional portion of the stored early echo data and the complementary fractional portion of the stored late echo data.

4. The method as set forth in claim 3 further including normalizing the magnitude of at least one of the stored early and late echo data.

5. The method as set forth in claim 3 further including adjusting the phase of at least one of the stored early and late echo data.

6. The method as set forth in claim 3 further including centering the stored early and late echo data.

7. The method as set forth in claim 6 wherein the centering step includes determining a data value with the greatest magnitude in each of the early and late echo data sets and shifting the data values such that the data value with the greatest magnitude is in the center of each collected data set.

8. The method as set forth in claim 7 further including the step of adjusting the phase of the early echo data such that the greatest magnitude early echo data value has a zero imaginary part and adjusting the phase of the late echo data such that the largest magnitude late echo data value has a zero imaginary part.

9. In a method of multiple echo magnetic resonance imaging in which magnetic resonance signals are collected during each of at least two of the multiple echoes, and the data corresponding to each of the multiple echoes are separately Fourier transformed into images, the improvement comprising:
before the Fourier transforming, combining a fraction of the magnetic resonance signal collected during each of the at least two echoes;
Fourier transforming the combined echo signals into a single synthesized image representation.

10. In a method of multiple echo magnetic resonance imaging in which magnetic resonance data is collected during each of at least two of the multiple echoes, the improvement comprising:
combining a portion of the data collected during each of the at least two echoes;
normalizing the at least two data portions such that a maximum magnitude data value in each echo is equivalent;
after the normalizing step, transforming the combined echo data portions into a synthesized image representation.

11. In a method of multiple echo magnetic resonance imaging in which magnetic resonance data is collected during each of at least two of the multiple echoes, the improvement comprising:
aligning at least a portion of data collected during at least two echoes about a data value of each echo which has the largest magnitude in the portion;
combining a fraction of the aligned data collected during each of the echoes;
transforming the combined echo data fractions into a synthesized image representation.

12. In a method of multiple echo magnetic resonance imaging in which magnetic resonance data is collected during each of at least two of the multiple echoes, the improvement comprising:
combining a portion of the data collected during each of the at least two echoes;
aligning the phase of the combined echo data portions;
transforming the phase aligned combined echo data portions into a synthesized image representation.

13. In a method of multiple echo magnetic resonance imaging in which magnetic resonance data is collected during each of two of the multiple echoes, the improvement comprising:
filtering the data from each of the two echoes with complementary filters to select high frequency components from one and complementary low frequency components from the other;
combining the separated high and low frequency components; and,
Fourier transforming the combined high and low frequency components into a synthesized image representation.

14. A method of producing synthetic images, the method comprising:
concurrently collecting first and second sets of frequency domain magnetic resonance data which are indicative of differing properties of a portion of a subject disposed in an image region;
separating a first fraction of the first frequency domain data set and a second fraction of the second frequency domain data set, the first and second fractions being complementary;
combining the complementary fractions of the first and second data sets to produce a synthesized frequency domain data set; and,
Fourier transforming the synthesized frequency domain data set into a synthetic spatial domain image representation.

15. An apparatus for magnetic resonance imaging the apparatus comprising:
a means for exciting magnetic resonance in dipoles disposed in an image region;
a means for selectively causing at least first and second magnetic resonance echoes;
a phase encoding means for selectively adjusting a phase encoding in the excited magnetic resonance from excitation to excitation;
a collecting means for receiving magnetic resonance signals generated by the dipoles during the echoes and digitizing each of the received magnetic resonance signals from the first echoes to generate first views of echo data and digitizing each of the magnetic resonance signals from the second echoes to generate second views of echo data;
a first filter means for separating a portion of the first echo data views;
a second filter means for separating a complementary portion of the second echo data views; and,
a Fourier transforming means for Fourier transforming the separated complementary first and second echo data view portions into a single image representation.

16. An apparatus as for magnetic resonance imaging, the apparatus comprising:
means for exciting magnetic resonance in dipoles disposed in an image region;
a means for selectively causing at least first and second magnetic resonance echoes;
a phase encoding means for selectively adjusting a phase encoding in the excited magnetic resonance from excitation to excitation;

a collecting means for receiving magnetic resonance signals generated by the dipoles during the echoes and digitizing the received signals to generate a view of echo data corresponding to at least the first and second echoes;

a first echo data memory means for storing echo data corresponding to the first echo;

a second data echo memory means for storing echo data corresponding to the second echo;

a centering means operatively connected with the first and second echo data memory means to bring the echo data in the first and second echo data memory means into coordination about the data value with the largest magnitude in each memory means;

a first filter means for separating a portion of the echo data in the first echo data memory means;

a second filter means for separating a complementary portion of the echo data from the second echo data memory means; and, a transforming means for transforming the separated complementary echo data portions into an image representation.

17. An apparatus for magnetic resonance imaging, the apparatus comprising:

means for exciting magnetic resonance in dipoles disposed in an image region;

a means for selectively causing at least first and second magnetic resonance echoes;

a phase encoding means for selectively adjusting a phase encoding in the excited magnetic resonance from excitation to excitation;

a collecting means for receiving magnetic resonance signals generated by the dipoles during the echoes and digitizing the received signals to generate a view of echo data corresponding to at least the first and second echoes;

a first echo data memory means for storing echo data corresponding to the first echo;

a second data echo memory means for storing echo data corresponding to the second echo;

a normalizing means for adjusting a magnitude of the echo data stored in at least one of the first and second echo data memory means;

a first filter means for separating a portion of the echo data in the first echo data memory means;

a second filter means for separating a complementary portion of the echo data from the second echo data memory means; and, a transforming means for transforming the separated complementary echo data portions into an image representation.

18. An apparatus for magnetic resonance imaging, the apparatus comprising:

means for exciting magnetic resonance in dipoles disposed in an image region;

a means for selectively causing at least first and second magnetic resonance echoes;

a phase encoding means for selectively adjusting a phase encoding in the excited magnetic resonance from excitation to excitation;

a collecting means for receiving magnetic resonance signals generated by the dipoles during the echoes and digitizing the received signals to generate a view of echo data corresponding to at least the first and second echoes;

a first echo data memory means for storing echo data corresponding to the first echo;

a second data echo memory means for storing echo data corresponding to the second echo;

a phase correction means for adjusting the phase of the echo data stored in at least one of the first and second echo data memory means;

a first filter means for separating a portion of the echo phase adjusted data in the first echo data memory means;

a second filter means for separating a complementary portion of the phase adjusted echo data from the second echo data memory means; and, a transforming means for transforming the separated complementary echo data portions into an image representation.

19. An apparatus for magnetic resonance imaging, the apparatus comprising:

means for exciting magnetic resonance in dipoles disposed in an image region;

means for selectively causing at least first and second magnetic resonance echoes;

a phase encoding means for selectively adjusting a phase encoding in the excited magnetic resonance from excitation to excitation;

a collecting means for receiving magnetic resonance signals generated by the dipoles during the echoes and digitizing the received signals to generate a view of echo data corresponding to at least the first and second echoes, each echo data view including a plurality of data values each having a real component and an imaginary component;

means for calculating a magnitude of each echo data value;

a first echo data memory means for storing echo data corresponding to the first echo;

a second data echo memory means for storing echo data corresponding to the second echo;

a first filter means for separating a portion of the echo data in the first echo data memory means;

a second filter means for separating a complementary portion of the echo data from the second echo data memory means; and, a transforming means for transforming the separated complementary echo data portions into an image representation.

20. The apparatus as set forth in claim 19 further including a centering means for finding a data value in each of the first and second echo data memory means which has the largest magnitude and for adjusting coordinate designations of the echo data values in at least one of the first and second echo data memory means to bring the largest magnitude data values to the same coordinate designation in both the first and second echo data memory means.

21. The apparatus as set forth in claim 20 further including a normalizing means for multiplying the magnitude of each data value in one of the first and second echo memory means by a ratio of the largest magnitude data values of the first and second each data memory means.

22. The apparatus as set forth in claim 19 further including means for multiplying each data value of the first echo data memory means by a complex conjugate of a largest magnitude data value in the first echo memory means and means for multiplying each data value of the second echo data memory means by a the complex conjugate of a largest magnitude data value of the second echo data memory means.

* * * * *